United States Patent
Udagawa et al.

(10) Patent No.: US 9,076,913 B2
(45) Date of Patent: Jul. 7, 2015

(54) GROUP III NITRIDE SEMICONDUCTOR LIGHT-EMITTING ELEMENT

(75) Inventors: Takashi Udagawa, Chichibu (JP); Hiroshi Udagawa, Yokohama (JP)

(73) Assignee: TOYODA GOSEI CO., LTD., Aichi (JP)

( * ) Notice: Subject to any disclaimer, the term of this patent is extended or adjusted under 35 U.S.C. 154(b) by 0 days.

(21) Appl. No.: 14/123,859

(22) PCT Filed: Jun. 12, 2012

(86) PCT No.: PCT/JP2012/065010
§ 371 (c)(1),
(2), (4) Date: Dec. 4, 2013

(87) PCT Pub. No.: WO2012/176661
PCT Pub. Date: Dec. 27, 2012

(65) Prior Publication Data
US 2014/0103293 A1   Apr. 17, 2014

(30) Foreign Application Priority Data
Jun. 21, 2011 (JP) ................. 2011-137703

(51) Int. Cl.
*H01L 29/06* (2006.01)
*H01L 31/00* (2006.01)
(Continued)

(52) U.S. Cl.
CPC ............ *H01L 33/06* (2013.01); *H01L 33/32* (2013.01)

(58) Field of Classification Search
CPC ................... H01L 33/06; H01L 33/32
USPC .......................... 257/14, 22, 79, 86
See application file for complete search history.

(56) References Cited

U.S. PATENT DOCUMENTS

2001/0055871 A1* 12/2001 Takeya et al. ............. 438/604
2002/0179923 A1* 12/2002 Morita et al. ............. 257/103
(Continued)

FOREIGN PATENT DOCUMENTS

JP   58-003834 A   1/1983
JP   06-164055 A   6/1994
(Continued)

OTHER PUBLICATIONS

Shuji Nakamura et al., "High-Brightness InGaN Blue, Green and Yellow Light-Emitting Diodes with Quantum Well Structures," Jpn. J. Appl. Phys., Jul. 1, 1995, pp. L797-L799, vol. 34, Part 2, No. 7A.
(Continued)

*Primary Examiner* — Zandra Smith
*Assistant Examiner* — John M Parker
(74) *Attorney, Agent, or Firm* — Sughrue Mion, PLLC (57) ABSTRACT

A group III nitride semiconductor light-emitting element provided with: a semiconductor layer obtained by laminating a first semiconductor layer of a first conduction type, a light-emitting layer, and a second semiconductor layer of an opposite second conduction type; a first electrode connected to the first semiconductor layer; and a second electrode provided on the surface of the second semiconductor layer; the light-emitting layer including a first gallium indium nitride layer of a first indium composition, disposed on a side opposite the light extraction direction; a second gallium indium nitride layer of a second indium composition less than the first, disposed on the light extraction direction side from the first gallium indium nitride layer; and an intermediate layer containing a material of a smaller lattice constant than the materials constituting the first and second gallium indium nitride layers, provided between the first and second gallium indium nitride layers.

14 Claims, 4 Drawing Sheets

(51) Int. Cl.
*H01L 33/06* (2010.01)
*H01L 33/32* (2010.01)

(56) References Cited

U.S. PATENT DOCUMENTS

2006/0131558 A1 6/2006 Sato et al.
2010/0288999 A1 11/2010 Kikuchi et al.

FOREIGN PATENT DOCUMENTS

| JP | 06-268257 | A | 9/1994 |
| JP | 2576819 | B1 | 1/1997 |
| JP | 10-022525 | A | 1/1998 |
| JP | 11-040850 | A | 2/1999 |
| JP | 2009-099893 | A | 5/2009 |
| JP | 2009-105423 | A | 5/2009 |
| WO | 2005/101532 | A1 | 10/2005 |
| WO | 2009/050955 | A1 | 4/2009 |

OTHER PUBLICATIONS

Shuji Nakamura et al., "InGaN-Based Multi-Quantum-Well-Structure Laser Diodes," Jpn. J. Appl. Phys., Jan. 15, 1996, pp. L74-L76, vol. 35, Part 2, No. 1B.

Shuji Nakamura et al., "$In_xGa_{(1-x)}N/In_yGa_{(1-y)}N$ superlattices grown on GaN films," J. Appl. Phys., Sep. 15, 1993, pp. 3911-3915, vol. 74, No. 6.

International Search Report of PCT/JP2012/065010 dated Jul. 10, 2012.

* cited by examiner

GROUP III NITRIDE SEMICONDUCTOR LIGHT-EMITTING ELEMENT

CROSS REFERENCE TO RELATED APPLICATIONS

This is a National Stage of International Application No. PCT/JP2012/065010 filed Jun. 12, 2012, claiming priority based on Japanese Patent Application No. 2011-137703 filed Jun. 21, 2011, the contents of all of which are incorporated herein by reference in their entirety.

TECHNICAL FIELD

The present invention relates to a group III nitride semiconductor light-emitting element including a light-emitting layer provided with plural gallium indium nitride layers having different indium compositions, in particular, relates to a group III nitride semiconductor light-emitting element, such as a light-emitting diode (abbreviation: LED) capable of emitting plural lights having different peak wavelengths in response to difference in the indium compositions.

BACKGROUND ART

Conventionally, gallium indium nitride (compositional formula: $Ga_xIn_{1-x}N$, $0 \leq X \leq 1$) has been used as a light-emitting layer for a light-emitting element that emits visible light of dark green, blue or the like (refer to Patent Document 1). Moreover, for example, it is shown that a $Ga_{0.4}In_{0.6}N$ layer to which zinc (chemical symbol: Zn) is added (doping is carried out) having a large indium composition is useful as a material for emitting red light (refer to Patent Document 1).

The light-emitting layer is in some cases configured with not only a numerically single gallium indium nitride layer, but also a superlattice structure using numerically plural gallium indium nitride layers having different indium compositions (refer to Non-Patent Document 1). Moreover, for example, there is a technical example in which configuration is made of a multiple quantum well (abbreviation: MQW) structure in which a multi-layered unit that includes a well layer constituted by plural gallium indium nitride layers having a constant indium compositions and a barrier layer constituted by a gallium nitride (GaN) layer is laminated plural times (refer to Patent Documents 2 to 4 and Non-Patent Document 2).

As the MQW structure, in the case of forming the light-emitting layer by use of the plural well layers and the plural barrier layers, there are some cases in which the gallium indium nitride layers or the gallium nitride layers to which impurities are intentionally added (doping is carried out) for forming a light-emitting layer having excellent conductivity (refer to Non-Patent Document 3). As n-type impurities for the group III nitride semiconductor, such as gallium nitride, silicon (chemical symbol: Si, refer to Patent Document 5), germanium (chemical symbol: Ge), tellurium (chemical symbol: Te), and selenium (chemical symbol: Se) are exemplified (refer to Patent Document 6).

CITATION LIST

Patent Literature

Patent Document 1: Japanese Examined Patent Application Publication No. 58-3834
Patent Document 2: Japanese Patent Application Laid-Open Publication No. 6-164055
Patent Document 3: Japanese Patent Application Laid-Open Publication No. 6-268257
Patent Document 4: Japanese Patent Application Laid-Open Publication No. 10-22525
Patent Document 5: Japanese Patent Application Laid-Open Publication No. 11-40850
Patent Document 6: Japanese Patent No. 2576819

Non Patent Literature

Non-Patent Document 1: Nakamura Shuji et al., "$In_xGa_{(1-x)}N/In_yGa_{(1-y)}N$ superlattices grown on GaN films", Journal of Applied Physics, United States of America, September 1993, Vol. 74, No. 6, pp. 3911-3915
Non-Patent Document 2: Nakamura Shuji et al., "InGaN-Based Multi-Quantum-Well-Structure Laser Diodes", Japanese Journal of Applied Physics, Japan, January 1996, Vol. 35, Part 2, No. 1B, pp. L74-L76
Non-Patent Document 3: Nakamura Shuji et al., "High-Brightness InGaN Blue, Green and Yellow Light-Emitting Diodes with Quantum Well Structures", Japanese Journal of Applied Physics, Japan, July 1995, Vol. 34, Part 2, No. 7A, pp. L797-L799

SUMMARY OF INVENTION

Technical Problem

Though the light-emitting layer is configured by laminating the gallium indium nitride layers having different indium compositions plural times, as well as laminating the plural gallium indium nitride layers having the same indium composition plural times, diffusion of indium is caused due to difference in concentration of the indium compositions.

Moreover, also in a case of constituting the light-emitting layer of the superlattice structure, such as the MQW structure, by use of the plural gallium indium nitride layers having different indium compositions, diffusion of indium cannot be sufficiently suppressed by the barrier layers simply provided between the gallium indium nitride layers. For this reason, though an attempt is made to obtain plural lights having different peak wavelengths in response to variations in the indium composition, there is a problem that the lights having different peak wavelengths cannot be obtained as they are intended.

An object of the present invention is to solve a problem that the lights having different peak wavelengths in response to variations in the indium composition cannot be obtained as they are intended, even though an attempt is made to obtain plural lights having different peak wavelengths.

Solution To Problem

The present invention is generated to solve the problems accompanied by the above-described conventional techniques. The inventor of the present invention focuses attention on the fact that the conventional barrier layers constituting a quantum well (abbreviation: QW) structure are the barrier layers against transportation of electrons or holes, and therefore, cannot serve as the diffusion barrier layers that suppress diffusion of atoms of indium with sufficient stability, so, the inventor of the present invention provides, in forming a light-emitting layer by use of plural gallium indium nitride layers having different indium compositions, a laminated structure of the light-emitting layer suitable for suppressing diffusion of the atoms in indium due to difference in concentration of the indium compositions.

Thus, according to the present invention, there is provided a group III nitride semiconductor light-emitting element of a pn junction type, including: a laminated semiconductor layer in which a first semiconductor layer having a first conduction type, a light-emitting layer, and a second semiconductor layer having a second conduction type showing a conductivity opposite to conductivity of the first conduction type are laminated; a first electrode that is connected to the first semiconductor layer; and a second electrode provided on a surface of the second semiconductor layer, wherein the light-emitting layer of the laminated semiconductor layer has a structural unit including: a first gallium indium nitride layer that is arranged on an opposite side of extraction direction of light emission from the light-emitting layer and has a first indium composition; a second gallium indium nitride layer that is arranged on the extraction direction side of the light emission compared to the first gallium indium nitride layer and has a second indium composition smaller than the first indium composition; and an intermediate layer that is provided between the first gallium indium nitride layer and the second gallium indium nitride layer, and composed of a material having a lattice constant smaller than a lattice constant of a material constituting the first gallium indium nitride layer and the second gallium indium nitride layer.

It is preferable that the structural unit including the first gallium indium nitride layer having a largest indium composition of the first indium composition in the light-emitting layer is arranged at a lowermost layer in the extraction direction of the light emission from the light-emitting layer.

It is preferable that the structural unit including the second gallium indium nitride layer having a smallest indium composition of the second indium composition in the light-emitting layer is arranged at an uppermost layer in the extraction direction of the light emission from the light-emitting layer.

It is preferable that the intermediate layer in the structural unit increases a thickness thereof corresponding to a difference in concentration ($\Delta$In) between the first indium composition ($X_1$) of the first gallium indium nitride layer and the second indium composition ($X_2$) of the second gallium indium nitride layer constituting the structural unit.

It is preferable that the intermediate layer in the structural unit is configured with a group III-V compound semiconductor.

It is preferable that the group III-V compound semiconductor is aluminum gallium nitride.

It is preferable that the intermediate layer in the structural unit contains a donor impurity composed of an element having an atomic radius smaller than an atomic radius of a group III element or a group V element.

It is preferable that, in the intermediate layer, a concentration of the donor impurity increases corresponding to a thickness of the intermediate layer.

Advantageous Effects of Invention

According to the present invention, in the group III nitride semiconductor light-emitting element, it is possible to obtain the light-emitting layer including gallium indium nitride layers emitting plural lights having different peak wavelengths corresponding to difference in concentration of the indium compositions.

That is, variations in the indium compositions caused by entry of indium from one gallium indium nitride layer into another gallium indium nitride layer are suppressed by arranging an intermediate layer between the plural gallium indium nitride layers having different indium compositions to constitute the light-emitting layer. Such a light-emitting layer can be applied to a multi-wavelength light-emitting element capable of simultaneously emitting plural lights having different peak wavelengths.

DESCRIPTION OF EMBODIMENTS

Hereinafter, an exemplary embodiment according to the present invention will be described in detail. It should be noted that the present invention is not limited to the following exemplary embodiment, but may be practiced as various modifications within the scope of the gist thereof. Moreover, each of the figures is used for illustration of the exemplary embodiment, and does not represent an actual size thereof.

<LED Chip 10>

Figure 1:
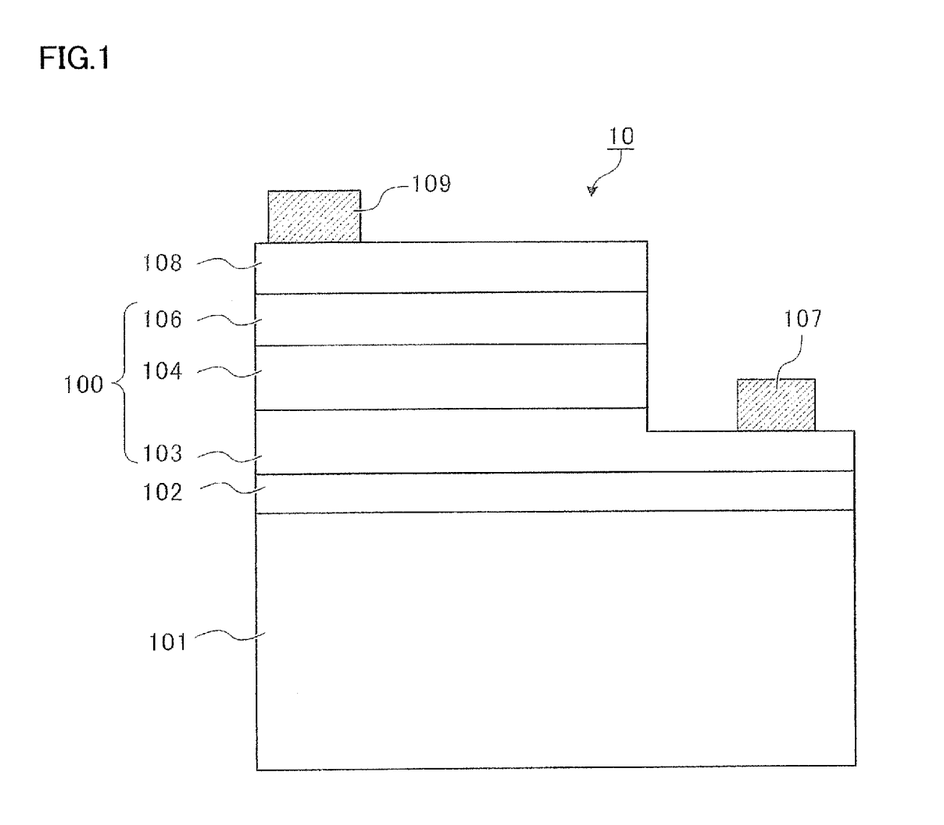
FIG. 1 is a cross-sectional schematic view showing a specific example of an LED chip as a group III nitride semiconductor to which an exemplary embodiment is applied.

FIG. 1 is a cross-sectional schematic view showing a specific example of an LED chip 10 as a group III nitride semiconductor to which an exemplary embodiment is applied.

Here, description will be given by using the LED chip 10 as a specific example of the group III nitride semiconductor light-emitting element. As shown in FIG. 1, the LED chip 10 includes a substrate 101 and an aluminum nitride (AlN) layer 102 laminated on the substrate 101. Moreover, the LED ship 10 includes a laminated semiconductor layer 100 laminated on the aluminum nitride layer 102 and a transparent conductive film 108 formed on the laminated semiconductor layer 100.

The laminated semiconductor layer 100 has, from the aluminum nitride layer 102 side: a lower cladding layer 103 configured with an n-type semiconductor layer as a first semiconductor layer having a first conduction type; a light-emitting layer 104 laminated on the lower cladding layer 103; and an upper cladding layer 106 laminated on the light-emitting layer 104 and configured with a p-type semiconductor layer as a second semiconductor layer having a second conduction type, which is opposite to the first conduction type. A detailed structure of the light-emitting layer 104 will be described later.

Moreover, the LED chip 10 includes an n-type ohmic electrode 107 as a first electrode, which is formed on a semiconductor layer exposure surface exposed by cutting out a part of the lower cladding layer 103 and a p-type electrode 109 as a second electrode, which is formed on a partial region of the transparent conductive film 108 formed on almost entire surface of the upper cladding layer 106.

The LED chip 10 of the exemplary embodiment has a structure in which the n-type ohmic electrode 107 as the first electrode and the p-type electrode 109 as the second electrode are formed on a surface side opposite to the substrate 101. In the LED chip 10, the light-emitting layer 104 is configured to emit light by assuming the n-type ohmic electrode 107 to be a negative pole and assuming the p-type electrode 109 to be a positive pole, and passing a current through the laminated semiconductor layer 100 (the lower cladding layer 103, the light-emitting layer 104 and the upper cladding layer 106) via both of them.

In the exemplary embodiment, as the substrate 101, a glass substrate, metal oxide crystals, such as sapphire (α-$Al_2O_3$ single crystal), zinc oxide (ZnO) or the like, with a crystal plane polarized or not polarized as a surface thereof, or semiconductor crystals such as silicon carbide (SiC), silicon (Si), gallium nitride (GaN) or the like of a hexagonal 6H type, hexagonal 4H type or 3C type can be listed. Moreover, as the substrate 101, an epitaxial growth layer configured with a group III nitride semiconductor layer, such as gallium nitride on the sapphire substrate, or a group III-V compound semiconductor, such as a boron phosphide (BP) on the sapphire substrate, can be used.

The aluminum nitride layer 102 is, for example, formed as an undoped high-resistance semiconductor layer with an aluminum (Al) simple metal as an aluminum source at a base temperature of 780° C.

In the exemplary embodiment, the lower cladding layer 103 is, for example, formed by use of silicon (Si)-doped n-type gallium nitride (GaN) with a silicon (Si) simple body as a doping source.

The upper cladding layer 106 is, for example, formed by use of p-type aluminum gallium nitride (compositional formula: $Al_xGa_{1-x}N$) doped with magnesium (chemical symbol: Mg).

The transparent conductive film 108 is, for example, formed by using indium tin oxide (abbreviation: ITO), indium zinc (chemical symbol: Zn) tin oxide (abbreviation: IZTO) or the like.

(Light-Emitting Layer 104)

Figure 2A:
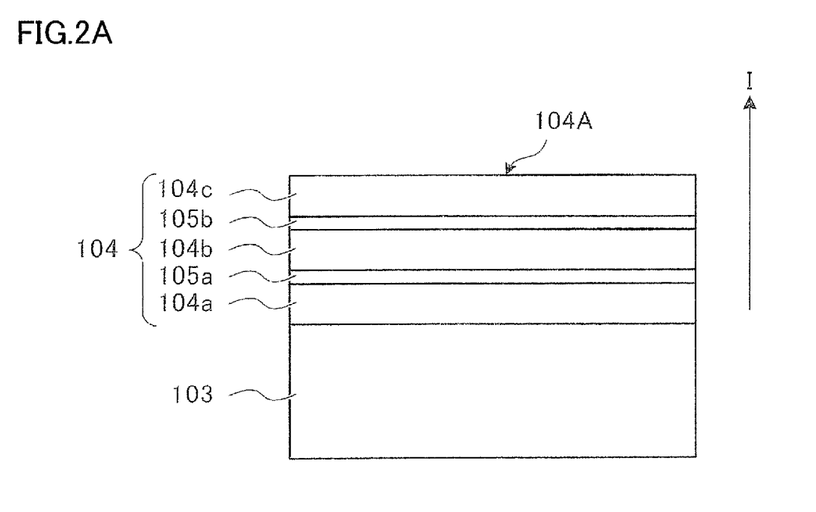
FIGS. 2A and 2B are cross-sectional schematic views showing specific examples of a light-emitting layer of the LED chip.

FIG. 2 is cross-sectional schematic views showing specific examples of the light-emitting layer 104 of the LED chip 10. FIG. 2A shows a specific example of the light-emitting layer 104 provided with plural intermediate layers. In FIG. 2A, I indicates an extraction direction of light emitted from the light-emitting layer 104 (a light emission extraction direction I), and thereby the light emission is extracted from a surface 104A side of the light-emitting layer 104, which is opposite to the lower cladding layer 103.

Figure 2B:
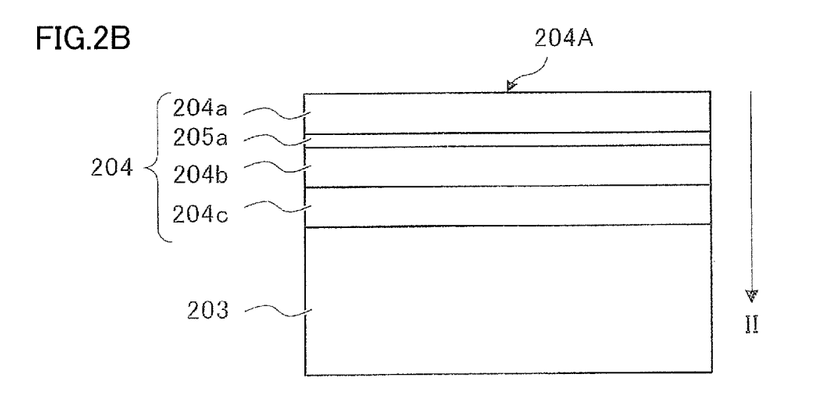

FIG. 2B is a specific example of another exemplary embodiment. In FIG. 2B, II indicates an extraction direction of light emitted from a light-emitting layer 204 (a light emission extraction direction II), and thereby the light emission is extracted from a lower cladding layer 203 side, which is opposite to a surface 204A of the light-emitting layer 204.

In the exemplary embodiment, as shown in FIG. 1, the light-emitting layer 104 of the LED chip 10 is formed on the lower cladding layer 103 as a base layer formed on the substrate 101 or a growth layer on the substrate 101.

As shown in FIG. 2A, the light-emitting layer 104 has a configuration unit including plural n-type gallium indium nitride layers (compositional formula: $Ga_{1-X}In_XN$, $0<X\le1$), and intermediate layers configured with aluminum gallium nitride (compositional formula: $Al_\alpha Ga_{1-\alpha}N$, $0\le\alpha<1$) that are diffusion barrier layers provided among the n-type gallium indium nitride layers, which are sequentially formed on a top surface of the lower cladding layer 103.

In the exemplary embodiment, as the n-type gallium indium nitride layer, a first gallium indium nitride layer 104a (compositional formula: $Ga_{1-X1}In_{X1}N$, $0<X_1\le1$) having a first indium composition ($X_1$), a second gallium indium nitride layer 104b (compositional formula: $Ga_{1-X2}In_{X2}N$, $0<X_2<1$) having a second indium composition ($X_2$) and a third gallium indium nitride layer 104c (compositional formula: $Ga_{1-X3}In_{X3}N$, $0<X_3<1$) having a third indium composition ($X_3$) are formed. As the diffusion barrier layers (the intermediate layers), a first intermediate layer 105a and a second intermediate layer 105b are formed.

In the exemplary embodiment, the indium composition of the n-type gallium indium nitride layer constituting the light-emitting layer 104 is set larger than the indium composition in the semiconductor layer that forms the lower cladding layer 103 or the upper cladding layer 106. The indium composition of the n-type gallium indium nitride layer constituting the light-emitting layer 104 is appropriately determined in response to a desired peak wavelength of light. As a determining method thereof, for example, as described in the aforementioned Patent Document 1, a method that carries out determination based on a relation between the indium composition and a forbidden band width is provided. In this case, even if there is a slight difference in a known bowing parameter, the fact remains that the higher the indium composition, the longer the wavelength of the emitted light becomes.

In the exemplary embodiment, the indium compositions of the plural n-type gallium indium nitride layers (the first gallium indium nitride layer 104a to the third gallium indium nitride layer 104c) for constituting the light-emitting layer 104 are formed so that, toward the light extraction direction I, the second indium composition ($X_2$) of the second gallium indium nitride layer 104b is smaller than the first indium composition ($X_1$) of the first gallium indium nitride layer 104a, and further, the third indium composition ($X_3$) of the third gallium indium nitride layer 104c is smaller than the second indium composition ($X_2$) of the second gallium indium nitride layer 104b ($X_3<X_2<X_1$).

In other words, in the exemplary embodiment, the first gallium indium nitride layer 104a, which has the largest indium composition (the first indium composition ($X_1$)) among the plural n-type gallium indium nitride layers (the first gallium indium nitride layer 104a to the third gallium indium nitride layer 104c) for constituting the light-emitting layer 104, is arranged at a position that is in the opposite side of the light extraction direction I and nearest the lower cladding layer 103. Consequently, the structural unit that includes the first gallium indium nitride layer 104a having the largest indium composition (the first indium composition ($X_1$)) of the indium compositions in the light-emitting layer 104 is arranged as the lowermost layer in the light extraction direction I of the light-emitting layer 104.

In the exemplary embodiment, further, the third gallium indium nitride layer 104c, which has the smallest indium composition (the third indium composition ($X_3$)) among the plural n-type gallium indium nitride layers, is arranged at a position that is farthest in the light extraction direction I as viewed from the lower cladding layer 103 (on the surface 104A of the light-emitting layer 104). Consequently, the third gallium indium nitride layer 104c having the smallest indium composition (the third indium composition ($X_3$)) and emitting light of the shortest wavelength is arranged as the uppermost layer in the light extraction direction I. Accordingly, in the light extraction direction I, absorption of light by the gallium indium nitride layers positioned on the upper side within the light-emitting layer 104 is suppressed, and light having high intensity is efficiently extracted to the outside.

In the exemplary embodiment, as the light extraction direction I is indicated, the LED chip 10 (FIG. 1) of a mode in which light is passed through the upper cladding layer 106 provided on the upper side in the light-emitting layer 104 to be extracted to the outside is employed.

In other words, in the exemplary embodiment (FIG. 2A), in the light-emitting layer 104 arranged at the midpoint position between the lower cladding layer 103 and the upper cladding layer 106 composed of a semiconductor material having a wide forbidden band width, such as the group III nitride semiconductor, the first gallium indium nitride layer 104a having the largest indium composition ($X_1$) is arranged in most proximity to the lower cladding layer 103.

On the other hand, as described later, in the case of an LED chip expected to use a mount (a support) of a so-called upside-down type which extracts light from a back surface side of the substrate 101 to the outside utilizing the use of the substrate 101 that is optically transparent, though the fact remains that the lower cladding layer 103 is utilized as the base layer in the growth of the light-emitting layer 104, the gallium indium nitride layer having the largest indium composition is arranged in most proximity to the upper cladding layer 106.

In the exemplary embodiment, each of the intermediate layers (105a and 105b) that are one of the constituents of the light-emitting layer 104 is arranged at the midpoint between two gallium indium nitride layers (104a and 104b, 104b and 104c) having the different indium compositions. In the exemplary embodiment, the gallium indium nitride layers (104a, 104b and 104c) and the intermediate layers (105a and 105b) are alternately laminated with repetition, to thereby configure the light-emitting layer 104 as a structure sandwiching the intermediate layer (105a and 105b) between the two gallium indium nitride layers.

In the exemplary embodiment, it is desirable that the intermediate layers (105a and 105b) positioned between the two gallium indium nitride layers (104a and 104b, 104b and 104c) are configured with a material having a lattice constant smaller than that of any one of the gallium indium nitride layers positioned on both sides thereof. In the exemplary embodiment, the intermediate layer is composed of aluminum gallium nitride (compositional formula: $Al_\alpha Ga_{1-\alpha}N$, $0 \leq \alpha < 1$). It is not preferable to use aluminum nitride (AlN), which does not contain gallium (an aluminum composition $\alpha=1$) compared to aluminum gallium nitride, because aluminum nitride (AlN) has a large forbidden band width, to thereby increase electrical resistance of the light-emitting layer 104. It is also suitable to configure the intermediate layers (105a and 105b) constituting the light-emitting layer 104 with layers having the same conduction type with the gallium indium nitride layer. For example, both of the intermediate layers (105a and 105b) and the gallium indium nitride layers are configured with conductive layers of n-type.

In the exemplary embodiment, the intermediate layer (105a and 105b) arranged between the two gallium indium nitride layers (104a and 104b, 104b and 104c) has the action of decreasing the amount of indium that enters from the gallium indium nitride layer existing on one side of the intermediate layer (105a and 105b) into the gallium indium nitride layer existing on the other side of the intermediate layer (105a and 105b) by diffusion.

In the exemplary embodiment, by changing the layer thickness of the intermediate layers (105a and 105b) depending on magnitude of the difference in concentration (ΔIn: in the exemplary embodiment, $X_1-X_2$, $X_2-X_3$) between the indium compositions ($X_1$, $X_2$, $X_3$) of the gallium indium nitride layers on the both sides, the action thereof can be exerted more effectively. It is preferable that the larger the difference in concentration (ΔIn) between the indium compositions of the gallium indium nitride layers on the both sides, the larger the thickness of the intermediate layers (105a and 105b). Moreover, since diffusion of atoms of indium is advanced more remarkably if the growth temperature of the gallium indium nitride layers (104a, 104b and 104c) and the intermediate layers (105a and 105b) is high, it is preferable to change depending upon the growth temperature when the gallium indium nitride layer is grown.

In the exemplary embodiment, a case is provided as a specific example, in which the plural gallium indium nitride layers having different indium compositions are laminated on the lower cladding layer 103 composed of gallium nitride and formed on the {111} surface of a silicone substrate by a molecular beam epitaxy (abbreviation: MBE) method with the temperature of the substrate 101 being 480° C. In this case, if the difference in concentration (ΔIn) between the indium compositions ($X_1$, $X_2$, $X_3$) of the gallium indium nitride layers on the both sides of each intermediate layer (105a or 105b) is, for example, 0.02, it is desirable to set the thickness of the intermediate layer (105a or 105b) at 8 nm to 22 nm. If the difference in concentration (ΔIn) between the indium compositions is excessively small, diffusion of atoms of indium within the gallium indium nitride layers is not caused remarkably. In this case, if the intermediate layers (105a and 105b) as thick diffusion barrier layers are arranged, there is a tendency that electrical resistance of the light-emitting layer 104 is increased.

In the exemplary embodiment, in the case where the plural gallium indium nitride layers (104a, 104b and 104c) are formed on the lower cladding layer 103 composed of n-type gallium nitride to which silicon is added, it is preferable to use a gallium nitride layer, in which atomic percentage of impurities such as silicon is reduced, as the lower cladding layer 103 in a region in the vicinity of the surface of the lower cladding layer 103. Consequently, it becomes possible to easily obtain a gallium indium nitride layer having a desired indium composition. Moreover, by reducing the atomic percentage of silicon or the like, which has an atomic radius smaller than that of gallium, it is possible to suppress reduction of crystal lattice in gallium nitride and to relieve lattice misfit for forming a gallium indium nitride layer having a lattice constant larger than that of gallium nitride.

In the exemplary embodiment, increase of the layer thickness of the intermediate layers (105a and 105b) prevents the atoms of indium from diffusing mutually between the gallium indium nitride layers (104a, 104b and 104c) on the both sides of the intermediate layers (105a and 105b) more effectively. On the other hand, if the intermediate layers (105a and 105b) are composed of a material having a forbidden band width wider than those of the gallium indium nitride layers (104a, 104b and 104c) for passing the light emitted from the gallium indium nitride layers (104a, 104b and 104c), the electrical resistance of the light-emitting layer 104 is increased. Accordingly, in the exemplary embodiment, it is preferable to increase the atomic percentage of donor impurities in the intermediate layers (105a and 105b) with increase of the layer thickness of the intermediate layers (105a and 105b). In other words, it is preferable that the thickest intermediate layer in the plural intermediate layers (105a and 105b) constituting the light-emitting layer 104 includes the donor impurities of the highest concentration.

In the exemplary embodiment, for example, in the case where the light-emitting layer 104 is configured by providing the two gallium indium nitride layers (104a and 104b, 104b and 104c) having different indium compositions and the one intermediate layer (105a or 105b) between the both layers, it is preferable that the larger the difference in concentration between the indium compositions of the two gallium indium nitride layers (104a and 104b, 104b and 104c) existing on both sides of the intermediate layer (105a or 105b), the larger the layer thickness of the intermediate layer (105a or 105b), which is a diffusion barrier layer. Moreover, it is also preferable to increase the atomic percentage of the donor impurities.

In the exemplary embodiment, it is preferable to configure the intermediate layers (105a and 105b) with a group III-V compound semiconductor having a wide forbidden band width, such as the group III nitride semiconductor. As the donor impurities contained in such intermediate layers (105a and 105b), silicon, germanium, tin (or stannum, chemical symbol: Sn) or the like can be exemplified. Of these, donor impurities, which are composed of elements having an atomic radius smaller than that of group III elements or group V elements constituting the group III-V compound semiconductor that forms the intermediate layers (105a and 105b), are preferred.

By containing the donor impurities having the small atomic radius to reduce the lattice of crystal, efficacy is exerted to block passage of indium (atomic radius=1.66 angstrom, unit: Å, 1 Å=0.1 nm) having a large atomic radius.

In the exemplary embodiment, for example, in the case where the intermediate layers (105a and 105b) are composed of gallium nitride, silicon (atomic radius=1.32 Å) or germanium (chemical symbol: Ge, atomic radius=1.37 Å), whose atomic radius is smaller than the atomic radius of an atom of gallium (atomic radius=1.41 Å), is suitably utilized as the donor impurities.

The intermediate layers (105a and 105b) containing silicon (Si) can be formed by the chemical vapor deposition method, such as a metal organic chemical vapor deposition (abbreviated as MOCVD, MOVPE or the like) method, the MBE method, a hydride method and a halyde method.

In the MOCVD method or the like, silane and the like, such as silane (molecular formula: $SiH_4$) and methyl silane (molecular formula: $(CH3)_xSiH_{4-X}$), can be used as a doping source of silicon (Si). Moreover, germane (molecular formula: $GeH_4$) and the like can be used as a doping source of germanium. In the MBE method, silicon or germanium of high purity can be used as a doping source of silicon or germanium.

In these growth means, the atomic percentage of the donor impurities in the intermediate layers (105a and 105b) is desirably from $5 \times 10^{17}$ atoms/cm$^3$ to $2 \times 10^{19}$ atoms/cm$^3$, and the concentration of the donor impurities is adjusted by varying a supply amount of a doping source to a growth reaction system. The atomic percentage of the donor impurities in the intermediate layers (105a and 105b) can be quantitatively determined by, for example, a secondary ion mass spectrometry (abbreviation: SIMS).

FIG. 2B is a specific example of another exemplary embodiment of the light-emitting layer 204 provided with plural intermediate layers.

The light-emitting layer 204 shown in FIG. 2B is formed on the lower cladding layer 203 composed of n-type gallium nitride, and light emission is extracted from the lower cladding layer 203 side (a light emission extraction direction II) (a light emission extraction style referred to as an upside-down type or a face-down type). The light-emitting layer 204 includes a first gallium indium nitride layer 204a having a first indium composition (A), a second gallium indium nitride layer 204b having a second indium composition (B, where B<A) and a third gallium indium nitride layer 204c having the second indium composition. Further, between the first gallium indium nitride layer 204a and the second gallium indium nitride layer 204b, an intermediate layer 205a composed of aluminum gallium nitride is formed.

In the exemplary embodiment, the second gallium indium nitride layer 204b and the third gallium indium nitride layer 204c having the smallest indium composition (B) are arranged in most proximity to the lower cladding layer 203, and the first gallium indium nitride layer 204a having the largest indium composition (A) is arranged on the surface 204A of the light-emitting layer 204, to thereby increase extraction efficiency of light emission to the outside.

In the exemplary embodiment, the single intermediate layer 205a is provided between the two gallium indium nitride layers having different indium compositions (the first gallium indium nitride layer 204a and the second gallium indium nitride layer 204b). This is because, since the second gallium indium nitride layer 204b and the third gallium indium nitride layer 204c have the same indium composition, there occurs no diffusion of atoms of indium between the layers. In the case where the intermediate layer is inserted between the two gallium indium nitride layers having the same indium composition, it is preferable to form a thin layer so that flow of the forward current is not hindered.

In the LED chip 10 to which the exemplary embodiment is applied, the upper cladding layer 106 configured with a semiconductor material having a forbidden band width wider than that of the gallium indium nitride layer constituting the light-emitting layer 104 is provided on the light-emitting layer 104. The upper cladding layer 106 is, for example, composed of aluminum gallium indium nitride mixed crystal (compositional formula: $Al_\alpha Ga_\beta In_\gamma N$: $\alpha+\beta+\gamma=1$). On the upper cladding layer 106, an ohmic electrode is laid corresponding to the electrical conduction type of the layer.

In the exemplary embodiment, for example, on the upper cladding layer 106 composed of p-type aluminum gallium nitride (compositional formula: $Al_\alpha Ga_\beta N$: $\alpha+\beta=1$), an anode (+) ohmic electrode is provided. As the anode (+) ohmic electrode, a transparent conductive oxide film or the like, which does not interfere with extraction of light emission to the outside, is preferably used. In the exemplary embodiment, for example, the transparent conductive film 108 configured with an indium tin oxide (abbreviation: ITO) film or an indium zinc (chemical symbol: Zn) tin oxide (abbreviation: IZTO) film is formed on the upper cladding layer 106. Then, on the transparent conductive film 108, the p-type electrode 109 used for connecting to a power supply terminal is arranged.

Moreover, on the lower cladding layer 103 below the light-emitting layer 104, which is composed of aluminum gallium indium nitride mixed crystal or the like, an ohmic electrode corresponding to the electrical conduction type of the layer is laid. For example, on the lower cladding layer 103 configured with the n-type gallium nitride layer, a cathode (−) ohmic electrode electrically connected thereto is provided. In providing the cathode electrode, if necessary, the upper cladding layer and the light-emitting layer existing on a region where the electrode is to be formed are removed by a dry etching method or the like. In the exemplary embodiment, the n-type ohmic electrode 107 as a cathode electrode formed on a semiconductor layer exposure surface exposed by cutting out a part of the lower cladding layer 103 is formed.

EXAMPLES

Next, the present invention will be described in detail by showing Examples and Comparative Examples; however, the present invention is not limited to these Examples.

Example 1

In this Example, the LED chip 10 that included the light-emitting layer 104 having the structure shown in FIG. 2 and was configured with the group III nitride semiconductor having the structure shown in FIG. 1 was prepared, and performance as the light-emitting element was measured.

On the surface of the substrate 101 composed of antimony (chemical symbol: Sb)-doped n-type (111)-silicon (Si), in which (111) crystal plane is a surface, each layer of group III nitride semiconductor, which will be described later, was grown by the molecular beam epitaxy (MBE) method. As a nitrogen source, nitrogen plasma generated by exciting a nitrogen gas (excitation electrical power=330 W) at high frequency (13.56 MHz) was used. In an opening portion of a cell for generating the nitrogen plasma that faced the substrate 101, a circular jetting plate in which plural minute holes with a diameter of 0.5 mm were punched was provided, to thereby reduce an intensity of a light emission peak owing to second positive molecular series of nitrogen molecules in a wavelength region not less than 250 nm and not more than 370 nm. Consequently, a nitrogen plasma atmosphere, in which the intensity of the light emission peak owing to the second positive molecular series of nitrogen molecules was not more than 1/10 of an intensity of light emission peak of nitrogen in an atomic state with a wavelength of 745 nm, was formed.

On the surface of the above-described substrate 101, with an aluminum simple metal as an aluminum source, an aluminum nitride (AlN) layer 102 (the layer thickness=30 nm), which was undoped and of high resistance, was grown with a base temperature of 780° C. A pressure in a growth chamber made of stainless steel in the growth time was set at $5 \times 10^{-3}$ Pa. Next, on the aluminum nitride layer 102, with a silicon (Si) simple body as a doping source, a lower cladding layer 103 (layer thickness: 3 μm, carrier concentration=$2 \times 10^{18}$ cm$^{-3}$) configured with a silicon (Si)-doped n-type gallium nitride (GaN) was grown. A flux amount of gallium was set at $1.1 \times 10^{-4}$ Pa. The pressure in the growth chamber in growing was set at $5 \times 10^{-3}$ Pa. The surface rearrangement structure in the course of the growth of the gallium nitride layer and at the time of finishing thereof was a (2×2) structure indicating that gallium existed more than nitrogen in stoichiometry.

Next, on the lower cladding layer 103 configured with a gallium nitride layer, the first gallium indium nitride layer 104a, which was n-type, constituting the light-emitting layer 104 was grown at a flow rate of the nitrogen gas for generating nitrogen plasma being 0.7 cc per minute. The first gallium indium nitride layer 104a having the highest indium composition among the three gallium indium nitride layers was formed with a flux amount of indium being set at $7.0 \times 10^{-8}$ Pa and a flux amount of gallium being set at $5.1 \times 10^{-8}$ Pa. The indium composition of the first gallium indium nitride layer 104a was set at 0.08 (=8%). The layer thickness of the first gallium indium nitride layer 104a was set at 12 nm.

Subsequently, on the first gallium indium nitride layer (the indium composition=0.08) 104a, the first intermediate layer 105a composed of n-type gallium nitride to which silicon (Si) was added was formed. The flux amount of gallium in forming the first intermediate layer 105a was, similar to the time when the above-described first gallium indium nitride layer 104a was formed, set at $5.1 \times 10^{-8}$ Pa. The flux of indium was interrupted by bringing a revolving shutter into a closed state.

Next to the first gallium indium nitride layer 104a, provision of the second gallium indium nitride layer 104b whose indium composition was 0.06 (=6%) was planned. Since the difference in concentration (ΔIn) of the indium compositions between the first gallium indium nitride layer 104a (In composition=0.08) and the second gallium indium nitride layer 104b was 0.02, the first intermediate layer 105a was formed to have a thickness within a range obtained from the following relational expression (1). That is, the thickness of the first intermediate layer 105a was set at 21 nm. It should be noted that the relational expression (1) matches better when the difference in concentration of the indium compositions is small (ΔIn<0.05).

$$900 \times \Delta \text{In} \leq t(\text{nm}) \leq 1100 \times \Delta \text{In} \quad \text{(Relational expression (1))}$$

Moreover, by a common SIMS analysis, the atomic percentage of silicon in the first intermediate layer 105a was substantially constant, which was $1.7 \times 10^{18}$ atoms/cm$^3$.

Next, while a shutter attendant on a cell containing indium was opened to set the flux amount of gallium at $5.1 \times 10^{-8}$ Pa, the second gallium indium nitride layer 104b, which was n-type, was formed on the first intermediate layer 105a as scheduled. The indium composition thereof was set at 0.06, which was smaller than the first indium composition by 0.02. The flux amount of indium was set at $5.5 \times 10^{-8}$ Pa. The layer thickness of the second gallium indium nitride layer 104b was set at 18 nm.

Subsequently over time, on the second gallium indium nitride layer 104b (the indium composition=0.06), the second intermediate layer 105b composed of n-type gallium nitride to which silicon (Si) was added was formed. The flux amount of gallium in forming the second intermediate layer 105b was, similar to the time when the above-described first intermediate layer 105a was formed, set at $5.1 \times 10^{-8}$ Pa. The flux of indium was interrupted by closing the revolving shutter. On the second intermediate layer 105b composed of n-type gallium nitride, it was determined that the third gallium indium nitride layer 104c whose indium composition was 0.03 (3%) was provided. Accordingly, since the difference in concentration (ΔIn) of indium compositions between the second gallium indium nitride layer 104b (In composition=0.06) and the third gallium indium nitride layer 104c was 0.03, the thickness of the second intermediate layer 105b was set at 30 nm.

The atomic percentage of the second intermediate layer 105b was set higher than that of the above-described first intermediate layer 105a. The atomic percentage ($N_{Si}$ (atoms/cm$^3$)) of silicon within the second intermediate layer 105b was set at $3 \times 10^{18}$ atoms/cm$^3$, which was a concentration within a range obtained by the relational expression (2) described as follows.

$$0.8 \times 10^{20} \times \Delta \text{In} \leq N_{Si} \leq 1.2 \times 10^{20} \times \Delta \text{In} \quad \text{(Relational expression (2))}$$

The symbol ΔIn described in the relational expression (2) is a difference in concentration of the indium compositions between the two gallium indium nitride layers (the second gallium indium nitride layer 104b and the third gallium indium nitride layer 104c) arranged on both sides of the intermediate layer.

Next, while the shutter attendant on the cell containing indium was opened to set the flux amount of gallium at $5.1 \times 10^{-8}$ Pa, the third gallium indium nitride layer 104c, which was n-type, was formed on the second intermediate layer 105b. The indium composition of the third gallium indium nitride layer 104c was set at 0.03, which was further smaller than any of those of the first gallium indium nitride layer 104a and the second gallium indium nitride layer 104b. The flux amount of indium was set at $4.0 \times 10^{-8}$ Pa. The layer thickness of the third gallium indium nitride layer 104c was set at 15 nm.

After the light-emitting layer 104, which was configured with layers of the first gallium indium nitride layer 104a to the third gallium indium nitride layer 104c having different indium compositions and the first intermediate layer 105a and the second intermediate layer 105b composed of gallium nitride and provided between the layers, was formed, the laminated structural body was taken out of the MBE growth chamber to the outside, and spectrum of luminescence from the light-emitting layer 104 was measured.

Figure 3:
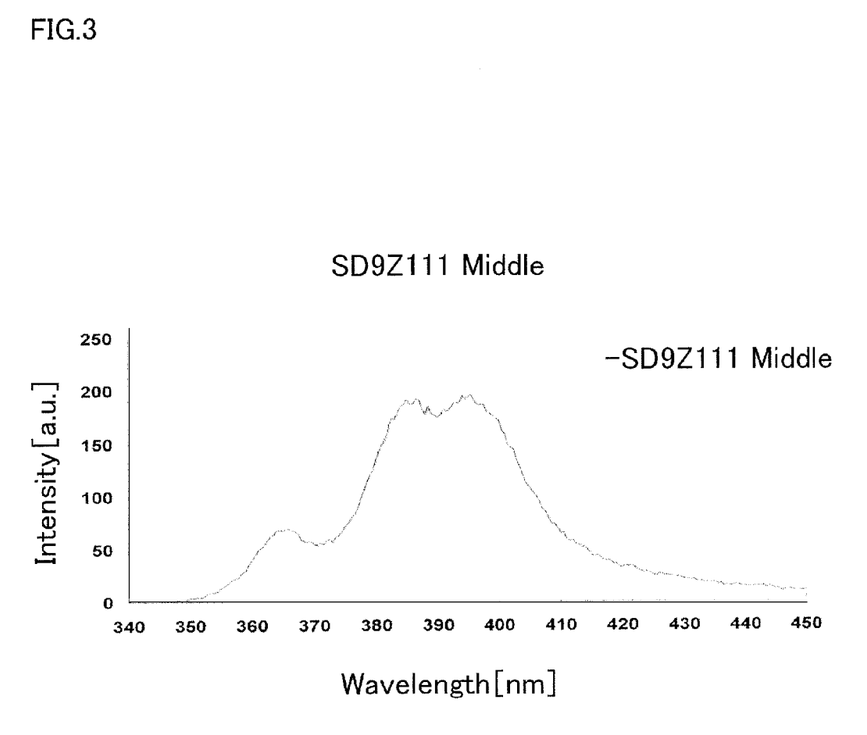
FIG. 3 shows a photoluminescence spectrum from a light-emitting layer prepared in Example 1.

FIG. 3 is a spectrum of photoluminescence (abbreviation: PL) from the light-emitting layer 104 prepared in this Example. As shown in FIG. 3, light emissions having peak wavelengths of 365 nm, 386 nm and 395 nm corresponding to the indium compositions of the first gallium indium nitride layer 104a to the third gallium indium nitride layer 104c were measured.

After the PL spectrum measurement at room temperature was finished, the laminated structural body was returned into the MBE chamber again. After the degree of vacuum within the chamber was stabilized, the upper cladding layer 106 composed of p-type aluminum gallium nitride (compositional formula: $Al_xGa_{1-x}N$) doped with magnesium (chemical symbol: Mg) was formed on the light-emitting layer 104. The aluminum composition (X) of the aluminum gallium nitride layer constituting the upper cladding layer 106 was set at 0.10 on a mating surface with the above-described third gallium indium nitride layer 104c. The aluminum composition was caused to be linearly reduced so as to be set at 0.03 at the point where the layer thickness reached 20 nm. From there, further, the aluminum composition was linearly varied to be 0 toward the surface.

A partial region of the upper cladding layer 106 configured with the aluminum gallium nitride layer in which a gradient was provided to the aluminum composition and the light-emitting layer 104 was removed by a common dry etching method. On the surface of the lower cladding layer 103 exposed by the removal, the n-type ohmic electrode 107 was provided. On the almost entire surface of the upper cladding layer 106 having been left, the transparent conductive film 108 composed of indium zinc tin oxide (abbreviation: IZTO) was deposited. On a partial region of the transparent conductive film 108, the p-type electrode 109 was formed.

Thereafter, the individual LED chips 10 with a length of one side being 350 μm were formed by a common cutting method, and optical and electrical properties of the LED were measured. The spectrum of light emitted from the upper cladding layer 106 side to the outside had the peak wavelength and relative light emission intensity that were similar to those of the PL spectrum shown in FIG. 4. The forward voltage when the forward current was set at 20 mA was 3.5V. In measuring change of the forward current of 20 mA with passage of time (current drift), there was little change in the forward current with passage of time during 25 minutes after the passing of current was started.

Comparative Example 1

In this comparative example, in the LED chip 10 prepared in the above-described Example 1, a light-emitting layer 104 having a structure not provided with the layers of the first intermediate layer 105a to the second intermediate layer 105b was formed. In other words, on the lower cladding layer 103 composed of gallium nitride, which was prepared in Example 1, the layers of the first gallium indium nitride layer 104a to the third gallium indium nitride layer 104c having the different indium compositions were continuously formed. Here, "continuously" means that no intermediate layers were arranged between the first gallium indium nitride layer 104a to the third gallium indium nitride layer 104c, and each of these layers were successively laminated.

Next, regarding the LED chip prepared by way of these operations, similar to Example 1, performance as the light-emitting element was measured.

Figure 4:
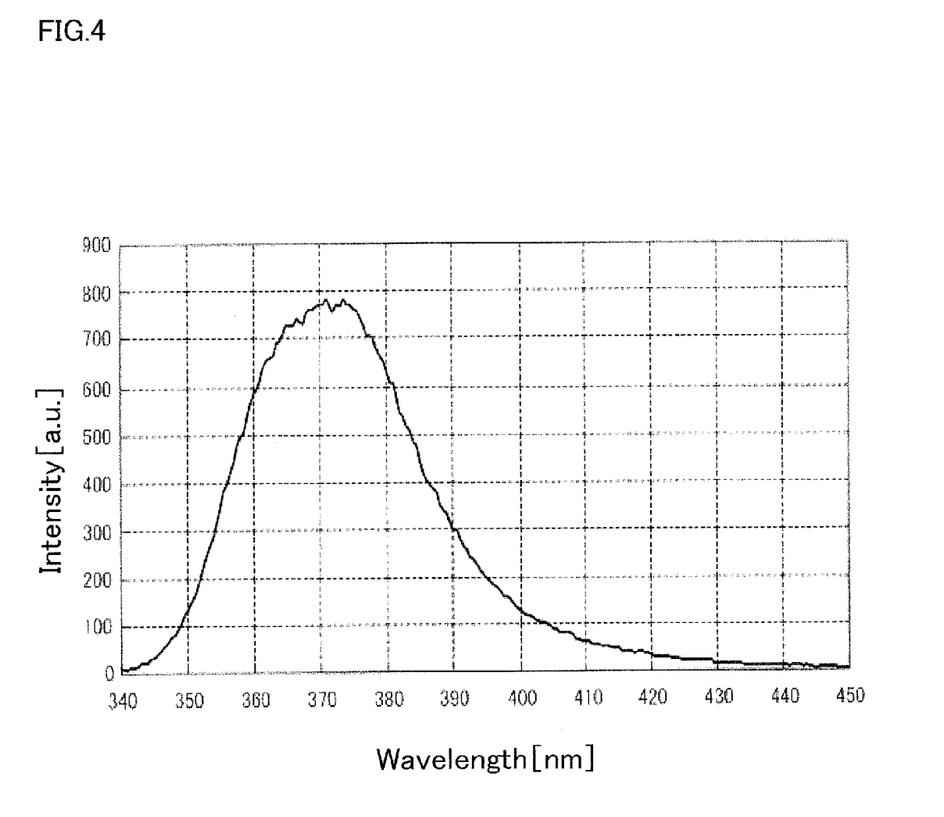
FIG. 4 shows a photoluminescence spectrum from a light-emitting layer prepared in Comparative Example 1.

FIG. 4 is a spectrum of photoluminescence from the light-emitting layer prepared in this Comparative Example. As shown in the photoluminescence spectrum in FIG. 4, in the case where the light-emitting layer 104 was configured without using any intermediate layer, only one light emission which had a wide half bandwidth and peak wavelength of about 372 nm was obtained. That is, omission of the intermediate layer led to a result vividly indicating that it was impossible to sufficiently prevent indium from diffusing mutually among the gallium indium nitride layers constituting the light-emitting layer 104, and after all, light emissions having plural peak wavelengths corresponding to the indium compositions were unavailable.

INDUSTRIAL APPLICABILITY

The function of emitting lights of multiple different wavelengths is, in other words, the function of absorbing plural lights having different wavelengths. Accordingly, since the light-emitting layer in the group III nitride semiconductor light-emitting element to which the exemplary embodiment is applied is capable of emitting not only light of single wavelength, but also lights of different peak wavelengths, it is possible to utilize the light-emitting layer as a light-absorbing layer for absorbing plural lights having different wavelengths, for example, a light-receiving layer to be used for a solar cell.

REFERENCE SIGNS LIST

10 . . . LED chip
100 . . . Laminated semiconductor layer
101 . . . Substrate
102 . . . Aluminum nitride layer
103, 203 . . . Lower Cladding layer
104, 204 . . . Light-emitting layer
104A, 204A . . . Surface of light-emitting layer
104a, 204a . . . First gallium indium nitride layer
104b, 204b . . . Second gallium indium nitride layer
104c, 204c . . . Third gallium indium nitride layer
105a, 205a . . . First intermediate layer
105b . . . Second intermediate layer
106 . . . Upper cladding layer
107 . . . N-type ohmic electrode
108 . . . Transparent conductive film
109 . . . P-type electrode

The invention claimed is:

1. A group III nitride semiconductor light-emitting element of a pn junction type, comprising:
a laminated semiconductor layer in which a first semiconductor layer having a first conduction type, a light-emitting layer, and a second semiconductor layer having a second conduction type showing a conductivity opposite to conductivity of the first conduction type are laminated;
a first electrode that is connected to the first semiconductor layer; and
a second electrode provided on a surface of the second semiconductor layer, wherein
the light-emitting layer of the laminated semiconductor layer has a structural unit including:
a first gallium indium nitride layer that is arranged on an opposite side of extraction direction of light emission from the light-emitting layer and has a first indium composition;
a second gallium indium nitride layer that is arranged on the extraction direction side of the light emission compared to the first gallium indium nitride layer and has a second indium composition smaller than the first indium composition; and a first intermediate layer that is provided between the first gallium indium nitride layer and the second gallium indium nitride layer, and composed of a material having a lattice constant smaller than a lattice constant of a material constituting the first gallium indium nitride layer and the second gallium indium nitride layer, the structural unit further comprising a second intermediate layer formed on the second gallium indium nitride layer and a third gallium indium nitride layer formed on the second intermediate layer, wherein the atomic percentage ($N_{Si}$ (atoms/cm$^3$)) of silicon within the second intermediate layer is a concentration within a range obtained by the relational expression (2):

$$0.8 \times 10^{20} \times \Delta In \leq N_{Si} \leq 1.2 \times 10^{20} \times \Delta In \quad \text{(Relational expression (2))},$$

wherein $\Delta In$ is a difference in concentration of the indium compositions between the second gallium indium nitride layer and the third gallium indium nitride layer arranged on both sides of the second intermediate layer.

2. The group III nitride semiconductor light-emitting element according to claim 1, wherein the structural unit including the first gallium indium nitride layer having a largest indium composition of the first indium composition in the light-emitting layer is arranged at a lowermost layer in the extraction direction of the light emission from the light-emitting layer.

3. The group III nitride semiconductor light-emitting element according to claim 1, wherein the structural unit including the third gallium indium nitride layer having a smallest indium composition of the second indium composition in the light-emitting layer is arranged at an uppermost layer in the extraction direction of the light emission from the light-emitting layer.

4. The group III nitride semiconductor light-emitting element according to claim 1, wherein the first intermediate layer in the structural unit increases a thickness thereof corresponding to the difference in concentration ($\Delta In$) between the first indium composition ($X_1$) of the first gallium indium nitride layer and the second indium composition ($X_2$) of the second gallium indium nitride layer constituting the structural unit.

5. The group III nitride semiconductor light-emitting element according to claim 1, wherein the first intermediate layer in the structural unit is configured with a group III-V compound semiconductor.

6. The group III nitride semiconductor light-emitting element according to claim 5, wherein the group III-V compound semiconductor is aluminum gallium nitride.

7. The group III nitride semiconductor light-emitting element according to claim 1, wherein the first intermediate layer in the structural unit contains donor impurities composed of an element having an atomic radius smaller than an atomic radius of a group III element or a group V element.

8. The group III nitride semiconductor light-emitting element according to claim 7, wherein, in the first intermediate layer, a concentration of the donor impurities increases corresponding to a thickness of the first intermediate layer.

9. The group III nitride semiconductor light-emitting element according to claim 7, wherein the atomic percentage of the donor impurities in the first intermediate layer is from $5 \times 10^{17}$ atoms/cm$^3$ to $2 \times 10^{19}$ atoms/cm$^3$.

10. The group III nitride semiconductor light-emitting element according to claim 9, wherein the atomic percentage of the donor impurities in the second intermediate layer is from $5 \times 10^{17}$ atoms/cm$^3$ to $2 \times 10^{19}$ atoms/cm$^3$.

11. The group III nitride semiconductor light-emitting element according to claim 1, wherein the thickness of the first intermediate layer is set at 8 nm to 22 nm when the difference in concentration ($\Delta In$) of the indium compositions between the first gallium indium nitride layer and the second gallium indium nitride layer on both sides of the intermediate layer is 0.02.

12. The group III nitride semiconductor light-emitting element according to claim 1, wherein the first intermediate layer is formed to have a thickness (t) within a range obtained from the following relational expression (1) when the difference in concentration ($\Delta In$) of the indium compositions between the first gallium indium nitride layer and the second gallium indium nitride layer on both sides of the intermediate layer is less than 0.05:

$$900 \times \Delta In \leq t(nm) \leq 1100 \times \Delta In \quad \text{(Relational expression (1))},$$

13. A group III nitride semiconductor light-emitting element of a pn junction type, comprising:

a laminated semiconductor layer in which a first semiconductor layer having a first conduction type, a light-emitting layer, and a second semiconductor layer having a second conduction type showing a conductivity opposite to conductivity of the first conduction type are laminated;

a first electrode that is connected to the first semiconductor layer; and a second electrode provided on a surface of the second semiconductor layer, wherein the light-emitting layer of the laminated semiconductor layer has a structural unit including:

a first gallium indium nitride layer that is arranged on an opposite side of extraction direction of light emission from the light-emitting layer and has a first indium composition;

a second gallium indium nitride layer that is arranged on the extraction direction side of the light emission compared to the first gallium indium nitride layer and has a second indium composition smaller than the first indium composition; and a first intermediate layer that is provided between the first gallium indium nitride layer and the second gallium indium nitride layer, and composed of a material having a lattice constant smaller than a lattice constant of a material constituting the first gallium indium nitride layer second gallium indium nitride layer, wherein the thickness of the first intermediate layer is set at 8 nm to 22 nm when the difference in concentration ($\Delta In$) of the indium compositions between the first gallium indium nitride layer and the second gallium indium nitride layer on both sides of the intermediate layer is 0.02, the structural unit further comprising a second intermediate layer formed on the second gallium indium nitride layer and a third gallium indium nitride layer formed on the second intermediate layer, wherein the thickness of the second intermediate layer is set at 8 nm to 22 nm when the difference in concentration ($\Delta In$) of the indium compositions between the second gallium indium nitride layer and the third gallium indium nitride layer on both sides of the second intermediate layer is 0.02.

14. A group III nitride semiconductor light-emitting element of a pn junction type, comprising:

a laminated semiconductor layer in which a first semiconductor layer having a first conduction type, a light-emitting layer, and a second semiconductor layer having a second conduction type showing a conductivity opposite to conductivity of the first conduction type are laminated;

a first electrode that is connected to the first semiconductor layer; and a second electrode provided on a surface of the second semiconductor layer, wherein the light-emitting layer of the laminated semiconductor layer has a structural unit including:

a first gallium indium nitride layer that is arranged on an opposite side of extraction direction of light emission from the light-emitting layer and has a first indium composition;

a second gallium indium nitride layer that is arranged on the extraction direction side of the light emission compared to the first gallium indium nitride layer and has a second indium composition smaller than the first indium composition; and a first intermediate layer that is provided between the first gallium indium nitride layer and the second gallium indium nitride layer, and composed of a material having a lattice constant smaller than a lattice constant of a material constituting the first gallium indium nitride layer and the second gallium indium nitride layer, wherein the first intermediate layer is formed to have a thickness (t) within a range obtained from the following relational expression (1) when the difference in concentration ($\Delta$In) of the indium compositions between the first gallium indium nitride layer and the second gallium indium nitride layer on both sides of the intermediate layer is less than 0.05:

$$900 \times \Delta\text{In} \leq t(\text{nm}) \leq 1100 \times \Delta\text{In} \qquad \text{(Relational expression (1))},$$

the structural unit further comprising a second intermediate layer formed on the second gallium indium nitride layer and a third gallium indium nitride layer formed on the second intermediate layer, wherein the second intermediate layer is formed to have a thickness (t) within a range obtained from the relational expression (1) when the difference in concentration ($\Delta$In) of the indium compositions between the second gallium indium nitride layer and the third gallium indium nitride layer on both sides of the second intermediate layer is less than 0.05.

* * * * *